United States Patent
Gfeller et al.

[11] Patent Number: 6,157,870
[45] Date of Patent: Dec. 5, 2000

[54] APPARATUS SUPPLYING COMPONENTS TO A PLACEMENT MACHINE WITH SPLICE SENSOR

[75] Inventors: Martin Gfeller, Schalunea; Otto Christen, Oensingen; Emil Grunder, Hägendorf, all of Switzerland

[73] Assignee: Zevatech Trading AG, Sezach, Switzerland

[21] Appl. No.: 09/021,717

[22] Filed: Feb. 10, 1998

[30] Foreign Application Priority Data

Feb. 18, 1997 [CH] Switzerland .............................. 361/97

[51] Int. Cl.[7] .................................................. G06F 17/00
[52] U.S. Cl. .............................................. 700/231; 221/73
[58] Field of Search ...................... 700/231, 244; 221/73, 6, 14, 25; 414/416

[56] References Cited

U.S. PATENT DOCUMENTS

| | | | |
|---|---|---|---|
| Re. 34,615 | 5/1994 | Freeman ...................................... 348/95 |
| 3,337,941 | 8/1967 | Drop .......................................... 29/203 |
| 4,144,449 | 3/1979 | Funk et al. ................................ 250/221 |
| 4,253,788 | 3/1981 | Oaks et al. ................................ 414/403 |
| 4,346,293 | 8/1982 | Fetzer ..................................... 250/222 R |
| 4,351,264 | 9/1982 | Fluam et al. ............................. 118/203 |
| 4,378,134 | 3/1983 | Eddy ........................................ 308/3.5 |
| 4,383,359 | 5/1983 | Suzuki et al. .............................. 29/712 |
| 4,584,047 | 4/1986 | Vanderpool et al. .................... 156/361 |
| 4,610,083 | 9/1986 | Campisi et al. ........................... 29/832 |
| 4,615,093 | 10/1986 | Tews et al. ................................ 29/407 |
| 4,810,154 | 3/1989 | Klemmer et al. ....................... 414/222 |
| 4,819,326 | 4/1989 | Stannek ..................................... 29/837 |
| 4,820,369 | 4/1989 | Kubo ...................................... 156/344 |
| 4,853,072 | 8/1989 | Thompson ............................... 156/470 |
| 4,863,149 | 9/1989 | Luther et al. .............................. 369/8 |
| 4,915,770 | 4/1990 | Haeda et al. ............................ 156/344 |
| 4,923,089 | 5/1990 | Hineno et al. ............................... 221/1 |
| 4,934,891 | 6/1990 | Hawkswell ............................... 414/223 |
| 4,937,511 | 6/1990 | Herndon et al. .................... 318/568.21 |
| 4,943,342 | 7/1990 | Golemon ................................ 156/584 |
| 4,986,462 | 1/1991 | Hethcoat ................................ 228/180.1 |
| 5,023,544 | 6/1991 | Vallone et al. ........................ 324/158 F |
| 5,024,720 | 6/1991 | Boss et al. ............................... 156/584 |
| 5,025,973 | 6/1991 | Newton et al. ............................ 228/55 |
| 5,046,851 | 9/1991 | Morgan ................................... 356/375 |
| 5,060,063 | 10/1991 | Freeman ................................. 358/101 |
| 5,075,965 | 12/1991 | Carey et al. .............................. 29/840 |
| 5,084,959 | 2/1992 | Ando et al. ............................... 29/740 |
| 5,086,559 | 2/1992 | Akatsuchi ................................. 29/834 |
| 5,150,423 | 9/1992 | Hoki ............................................. 382/8 |
| 5,152,858 | 10/1992 | Winter .................................... 156/157 |
| 5,157,617 | 10/1992 | Ramsey ................................... 364/478 |
| 5,157,734 | 10/1992 | Chen et al. .................................. 382/8 |
| 5,191,693 | 3/1993 | Umetsu .................................... 29/429 |
| 5,195,234 | 3/1993 | Pine et al. ................................. 29/720 |

(List continued on next page.)

FOREIGN PATENT DOCUMENTS

| | | |
|---|---|---|
| 0 236 225 | 9/1987 | European Pat. Off. ....... H05K 13/02 |
| 0 340 100 | 11/1989 | European Pat. Off. ....... G06K 19/06 |
| 0 462 596 A1 | 12/1991 | European Pat. Off. ........ H01L 21/00 |

(List continued on next page.)

OTHER PUBLICATIONS

Gore, et al., Fluxing Tool Incorporated Into Part Feeder; Specifically for Assembly of C–5 Chip Carriers, Motorola Inc., Technical Developments, vol. 13, Jul. 1991, pp. 36–37.

*Primary Examiner*—Christopher P. Ellis
*Assistant Examiner*—Khoi H. Tran
*Attorney, Agent, or Firm*—D'Alessandro & Ritchie

[57] ABSTRACT

Supply of tape components in which a tape replacement can be performed without any loss in performance is provided for by unwinding a first tape from a first reel, moving components located in the pockets of said first tape to a pickup position where they are picked up by a placement machine, splicing the end of said first tape to the start of a second tape wound on a second reel, and replacing said first reel by said second reel. A splice sensor is included for detecting a splice between the first and second tape. The signals from such splice sensor allow for an automatic and synchronous take over of the related data of the newly joined second tape.

12 Claims, 4 Drawing Sheets

U.S. PATENT DOCUMENTS

| | | | |
|---|---|---|---|
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,339,939 | 8/1994 | Geuble et al. | 198/345.2 |
| 5,342,460 | 8/1994 | Hidese | 156/64 |
| 5,380,099 | 1/1995 | Teramachi | 384/45 |
| 5,400,497 | 3/1995 | Watanabe et al. | 29/705 |
| 5,415,693 | 5/1995 | Yoneda et al. | 118/664 |
| 5,455,409 | 10/1995 | Smith et al. | 235/385 |
| 5,459,794 | 10/1995 | Ninomiya et al. | 382/145 |
| 5,475,919 | 12/1995 | Wu et al. | 29/841 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,547,537 | 8/1996 | Reynolds et al. | 156/351 |
| 5,553,376 | 9/1996 | Solanki et al. | 29/833 |
| 5,559,727 | 9/1996 | Deley et al. | 364/559 |
| 5,562,384 | 10/1996 | Alvite et al. | 414/222 |
| 5,564,188 | 10/1996 | Akasako et al. | 29/898.03 |
| 5,592,562 | 1/1997 | Rooks | 382/150 |
| 5,650,081 | 7/1997 | Hudson | 219/229 |
| 5,669,970 | 9/1997 | Balog et al. | 118/213 |
| 5,694,443 | 12/1997 | Stone et al. | 377/6 |
| 5,708,419 | 1/1998 | Isaacson et al. | 340/572 |
| 5,713,125 | 2/1998 | Watanabe et al. | 29/833 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,813,304 | 9/1998 | Matthias et al. | 83/365 |
| 5,838,754 | 11/1998 | Olson et al. | 364/478.07 |
| 5,885,052 | 3/1999 | Tsuji | 414/744.6 |
| 5,901,892 | 5/1999 | Takanashi | 226/27 |
| 5,938,890 | 8/1999 | Schlinkmann et al. | 156/541 |
| 5,941,674 | 8/1999 | Briehl | 414/417 |
| 5,975,395 | 11/1999 | Takada et al. | 226/162 |
| 5,976,306 | 11/1999 | Davis et al. | 156/344 |

FOREIGN PATENT DOCUMENTS

| | | | |
|---|---|---|---|
| 0 476 577 A2 | 3/1992 | European Pat. Off. | H05K 13/00 |
| 0 647 943 A1 | 4/1995 | European Pat. Off. | G11C 5/00 |
| 0 649 719 A1 | 4/1995 | European Pat. Off. | B29C 45/14 |
| 0 682 321 A2 | 11/1995 | European Pat. Off. | G06K 19/77 |
| 2 548 857 | 7/1983 | France | H05K 3/00 |
| 28 34 836 | 8/1978 | Germany | H05K 13/00 |
| 29 39 102 | 9/1979 | Germany | B05C 1/08 |
| 34 24 323 A1 | 7/1984 | Germany | H05K 13/02 |
| 35 44 221 A1 | 12/1985 | Germany | H05K 13/04 |
| 37 36 563 A1 | 10/1987 | Germany | H05K 13/02 |
| 41 27 696 A1 | 8/1991 | Germany | H05K 13/02 |
| 2-303751 | 12/1990 | Japan | B23Q 15/22 |
| 3-008655 | 1/1991 | Japan | B65H 26/00 |
| 3-133763 | 6/1991 | Japan | B65D 73/02 |
| 5-145283 | 6/1993 | Japan | H05K 13/02 |
| 6-089910 | 3/1994 | Japan | H01L 21/52 |
| 8-340175 | 12/1996 | Japan | H05K 3/34 |
| 9-064094 | 3/1997 | Japan | H01L 21/60 |
| 676 703 A5 | 2/1991 | Switzerland | B65H 21/00 |
| 2 111 863 | 12/1983 | United Kingdom | B05B 13/00 |
| 2 183 820 | 6/1987 | United Kingdom | G05D 3/10 |

APPARATUS SUPPLYING COMPONENTS TO A PLACEMENT MACHINE WITH SPLICE SENSOR

PRIORITY CLAIM

This application claims the priority of earlier filed Swiss application number 361/97, filed on Feb. 18, 1997.

BACKGROUND OF THE INVENTION

1. Field of the Invention

The present invention relates to the field of automatic placement of electronic components on electronic circuits. More particularly, the present invention relates to a method and apparatus for supplying components to a placement machine.

2. The Prior Art

The automatic placement of electronic circuits (PCBs or similar) by means of placement machines has been known for some time and is used, in particular, whenever complex and extensive circuits are required to have a fairly large number of components placed on them quickly, efficiently, and without a large number of errors. The components in this process are sorted by type on individual tapes which are rolled on reels fed in steps, by means of a corresponding feeder, past a pickup position where they are picked up by a handling machine and placed in their allocated position in the circuit. In this process, the components are stored individually on the tape in pockets positioned periodically one after the other and are normally protected against falling or damage by an overlying cover tape. Such automatic placement devices are known, for example, from U.S. Pat. Nos. 4,610,083, 4,653,664, 5,191,693, 5,289,625 and 5,515,600, or from Japanese patent applications Japanese Patent Document Nos. A-05145283, A-02135800, A-03133763, and A-03008655.

If, in the operation of such a placement machine in the on-going placement process, more components of one type are needed than are stored on the corresponding tape reel, a new reel with a new tape has to be inserted in the feeder when the tape is drawing to an end. To do this, it is necessary to inform the operator when the end of the tape is reached so that corresponding actions can be initiated. Various solution proposals have already been made for this problem. For example, in Japanese Patent Document Nos. A-03008655, A-05145283, U.S. Pat. No. 4,653,664 or U.S. Pat. No. 5,191,693, the solution proposed was to apply different kinds of markings to the tape, in particular to the cover tape, which were then detected by a sensor positioned before or after the pick-up position and which gave a warning prior to this end of tape and simultaneously allowed an estimate or computation of the remaining utilization time of the inserted tape. Other proposals, such as those from Japanese Patent Document Nos. A-02135800 and A-03133763, use a coded sequence of empty and full pockets within the tape as the marking, the sequence corresponding at the output of the sensor to a certain bit pattern which can be processed in the control of the device.

Although the operator can prepare in good time for a coming tape replacement thanks to the prior warning or the prior display of the placement machine, the tape replacement itself requires an interruption in the placement process. The feeder is pulled out of its inserted position on the placement machine, the empty reel is replaced by a full reel with a new tape, the tape start of the new tape is threaded in and the feeder is reinserted in its inserted position on the placement machine. At the same time, the characteristic data (tape length, tape width, pitch, number of pockets or components, type of components) of the new tape has to be entered in the placement machine and activated so that the placement process can be continued in the standard manner. As a result of this, downtimes occur in placement which limit or reduce the placement performance of the whole unit.

It is therefore the object of the invention to provide a method for the supply of components in which a tape replacement can be performed without any loss in performance as well as a suitable feeder and placement machine for this method.

It is a further object of the present invention to provide for a splice sensor which allows an automatic and synchronous takeover of the relevant data (in particular component quantity) of the newly joined tape.

It is a further object of the present invention to provide for an empty pocket sensor which allows automatic control of the feeder and the placement machine with the evaluation of an empty-pocket code. The empty pocket code can then signal a batch end or a batch start on the tape.

It is a further object of the present invention to provide for a splice process which can be performed a synchronously during the placement process.

It is a further object of the present invention to prevent placement errors by splicing in a controlled manner by means of a barcode, where release for the joined tape is only given with an agreement of the data contents of the two barcodes (old/new tape), as well as for controlled and synchronous takeover of the relevant data of the joined tape such as: tape width, pitch, component identification/dimensions/values/quantity, process data, etc.

It is a further object of the present invention to provide for a programmable number of components per circuit which are guaranteed to be from the same batch are made available to the placement machine for mounting on a circuit.

It is a further object of the present invention to provide for no loss of placement performance by having the feeder controlled automatically, i.e. any insufficient quantity of components at the batch end is rejected and the feeder automatically advances to the next batch start.

BRIEF DESCRIPTION OF THE INVENTION

Supply of tape components in which a tape replacement can be performed without any loss in performance is provided for by unwinding a first tape from a first reel, moving components located in the pockets of said first tape to a pickup position where they are picked up by a placement machine, splicing the end of said first tape to the start of a second tape wound on a second reel, and replacing said first reel by said second reel.

In a preferred embodiment of the present invention, a tape sensor is added which can detect the slice as well as a certain coded sequence of empty and full pockets which contains characteristic data about the tape.

DETAILED DESCRIPTION OF THE INVENTION

Figure 1:
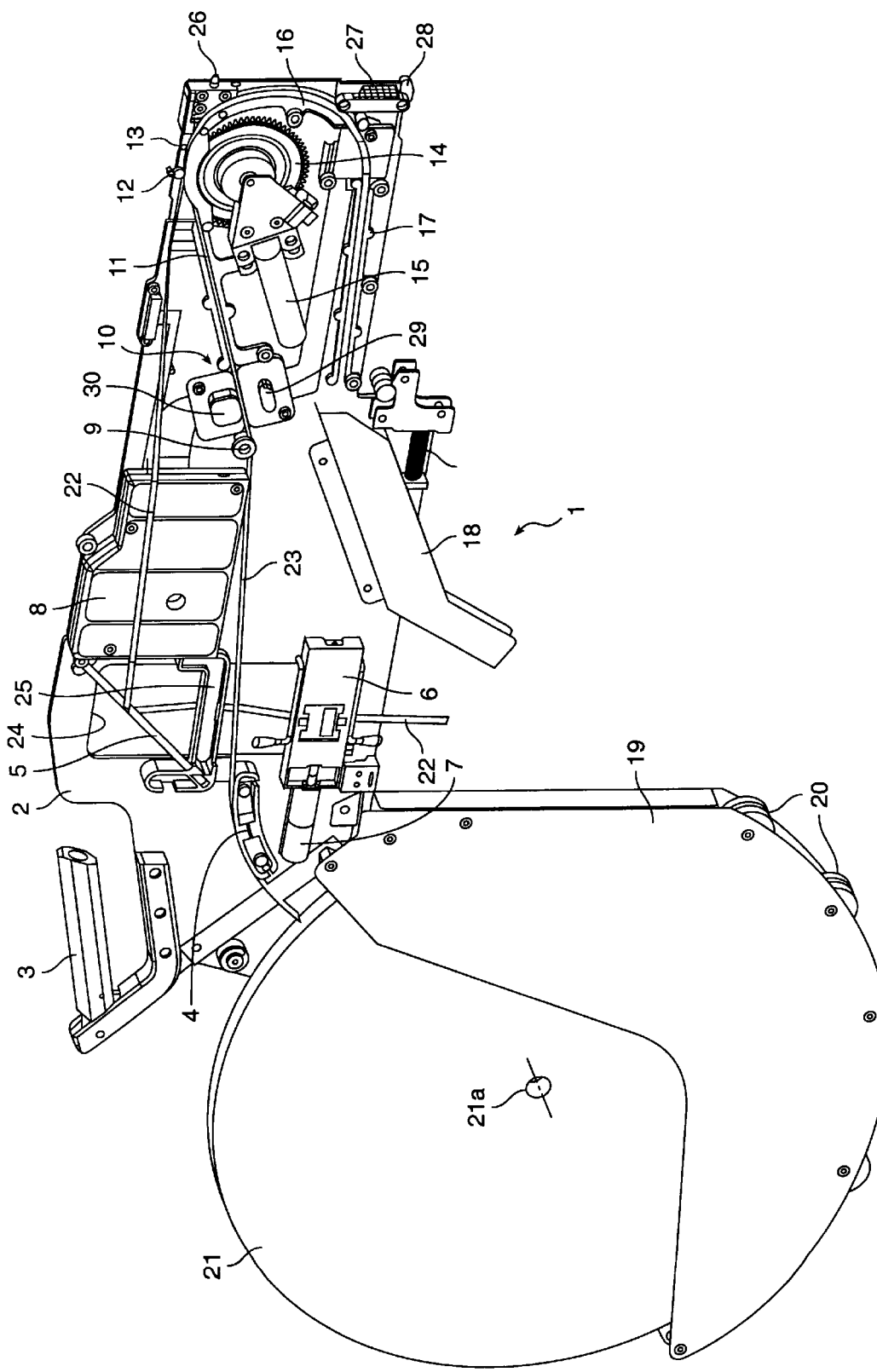
FIG. 1 shows a perspective side view of a preferred embodiment for a feeder in accordance with the present invention.

Referring to FIG. 1, a preferred embodiment of a feeder in accordance with the invention is shown in a perspective side view. The feeder 1 is mounted on a base plate 2 made from metal provided with a handle 3, on which base plate a reel cassette 19 has been screwed. The reel cassette 19 is open towards the top. A reel 21 with the tape wound on it containing the components can be inserted in it and turned freely on a plurality of rollers 20 positioned on the lower edge of the reel cassette 19. The axle 21a of the reel 21 has no function here. With this design of the reel cassette 19 it is possible, in several feeders positioned closely to each other on the placement machine, to take out the reel 21 easily for the purpose of splicing the respective tapes and putting it back without having to take off the feeder 1 itself. The tape 23 is guided to the front and out of the reel 21 through the central part of feeder 1, where at a pickup position 13 a pickup head (not shown in FIG. 1 but 62 in FIG. 5) of a placement machine (not shown in FIG. 1 but 55 in FIG. 4) picks up the components.

Below the pickup position 13, a transport gear 14 driven by a drive motor 15 is positioned. The transport gear 14 is designed as a cog and engages with its teeth corresponding perforations in the tape 23. The transport of the tape 23 by the transport gear 14 is performed in steps and is controlled by an electronic control unit 8 which is fitted in the feeder means 1. The guidance of the tape 23 from out of the reel 21 to the transport gear 14 is effected via a first, slightly bent guide element 4, a corner pulley 9 and a first guidance channel 11. Between the corner pulley 9 and the entrance to the first guidance channel an (optical) tape sensor 10 is provided whose function will be described in more detail below.

The tape 23 comprises, in a known manner, a supply tape provided with pockets for the components which is closed by a glued cover tape. Prior to the pickup position 13, the cover tape 22 is pulled off to the back counter to the transport direction of the tape 23 by means of a pull-off device 12 such as is described U.S. Pat. No. 5,213,653. The supply tape is led around the transport gear 14 behind the pickup position 13 by a second, curved guidance channel 16 and to the back by a third, straight guidance channel 17 and directed downwards and out of the feeder means 1 by a further guidance element 18.

The cover tape 22 pulled off runs without any further guidance past the control unit 8 to a deflector shaft 5 and is there deflected downwards and simultaneously turned through 90 degrees in the tape axis so that the surface of the cover tape 22 behind the deflector shaft 5 is orientated roughly parallel to the base plate 2. The combined deflection and turning of the cover tape is achieved by the deflector shaft 5 lying in the plane of the tape 23 or the cover tape 22 and by the deflector shaft 5 enclosing an angle of around 45 degrees with the direction of travel of the cover tape 22 removed.

The deflector shaft 5 is positioned somewhat above the base plate 2. So that the deflected cover tape 22 can be placed easily around the deflector shaft 5 and guided below the deflector shaft 5 safely past the tape 23 running past there, a recess 24 is provided in the base plate 2 below the deflector shaft 5 and in the area between the deflector shaft 5 and the drive unit 6. The cover tape 22 is led past the tape 23 in its orientation turned through 90 degrees in the recess 24. To guide the cover tape 22 in the recess 24, a guide element is provided which has, in particular, the shape of a stationary stirrup 25 positioned laterally to the direction of the cover tape 22.

The cover tape 22 pulled off is transported (pulled) by means of a drive unit 6 driven by a separate drive motor 7, which drive unit 6 is positioned below the stirrup 25 at the lower edge of the recess 24. The drive unit 6 for the cover tape 22 lies in the tape plane, i.e. the drive axle is parallel to the tape plane or to the base plate 2. To insert the cover tape 22 a flipup top part can be opened and then closed again in a known manner on the drive unit 6.

The feeder 1 is inserted by means of a handle 3 with its front section, in which the transport gear 14 is positioned, into a corresponding mount in the placement machine. A guide pin 26 at the top and a guide nose 28 located on the bottom side serve to guide and center it. A connection to the placement machine for the exchange of electrical signals is created by a multiple plug contact 27 placed between the guide pin 26 and the guide nose 28. This configuration is essentially already known from the applicant's invention in U.S. Pat. No. 5,024,720.

The tape sensor 10 is designed as an optically operating transmitted-light sensor. It consists of an (optical) transmission unit 29 equipped with LEDs or the equivalent and an (optical) receiving unit 30 opposing the transmission unit equipped with corresponding photosensitive elements such as photodiodes or the equivalent. The tape 23 is led through the two units 29, 30 in such a way that certain markings on the tape function as changes in the light transmission between transmission unit 29 and receiving unit 30 and are converted into electronic signals which are available for further processing.

One essential task of the tape sensor 10 comprises the detection of a splice within the tape 23. Such a splice occurs when, in accordance with the present invention, prior to the end of a first tape unwound from a first reel 21 in the feeder 1, in an ongoing placement process, the tape end of the first tape and the tape start of a second tape wound on a second reel are connected to each other by means of a splice, the first reel 21 then being replaced in the feeder 1 with the second reel and the components located in the pockets of the second tape being transported by the feeder 1 automatically one after the other to the pick-up position 13 after the first tape has run out. In this process, the splice is led past the tape sensor 10 where it can be detected.

Figure 2:
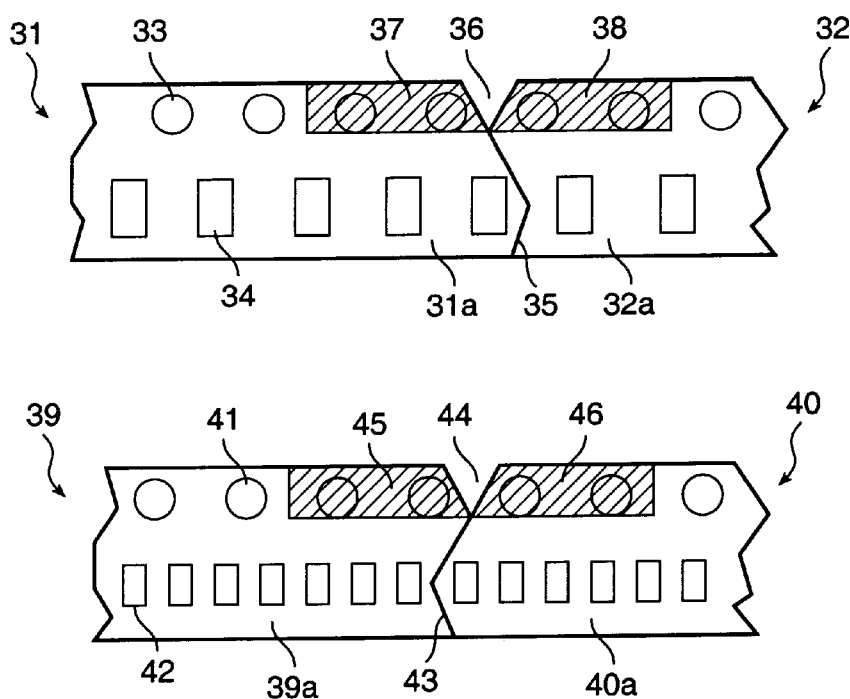
FIG. 2 shows a top view of two exemplary splice connections such as are preferably used in accordance with the invention.

Preferred examples for a splice are shown in FIG. 2 for two pairs of tapes 31, 32 or 39, 40, with different pitches. The tapes 31, 32 and 39, 40 each contain a continuous row of periodically repeated pockets 34 or 42 for the components and perforations 33 or 41 for the tape transport (with the transport gear 14 in FIG. 1). The tape ends 32a and 40a of the first tapes 32 or 40 and the tape starts 31a or 39a of the second tapes 31 or 39 are cut in a splicing apparatus (not shown) and connected (glued) together in such a way that the splices 35 or 43 shown in FIG. 2 are produced. The wedge-shaped recesses 36 or 44 of the splices 35 or 43 in the area of the perforations 33 or 41 are important for the detection of the splices 35, 43. These recesses 36, 44 serve as markings which signal the existence of the splice and are detected by the tape sensor 10. The recesses 36, 44 are preferably positioned right in the center of the (4 mm) division determined by the perforations 33, 41 so that the detection signal of the tape sensor 10 based on these can be linked directly to the tact signal for the transport gear 14.

As the tapes 31, 32 or 39, 40 are as a rule made of transparent plastic, the recesses 36, 44 per se only lead to a slight change in the light transmission. Therefore, to obtain clear and distinct detection signals, optically opaque mask sections 37, 38 or 45, 46 are provided on the spliced tape preferably before and/or after the recess 36 or 44, such mask sections being marked as in FIG. 2 by cross-hatching. If full light transmission is assigned a logical "1" and non-transmission of light a logical "0", then in the configuration of the mask sections 37, 38 or 45, 46 and of the recesses 36 or 44 shown in FIG. 2 with a pitch which corresponds to half the distance between consecutive perforations 33, 41 (namely 2 mm) a signal sequence is produced at the tape sensor 10 in each case of "0001000" which can be easily and distinctly discriminated as a splice signal by the tape sensor 10.

Figure 3:
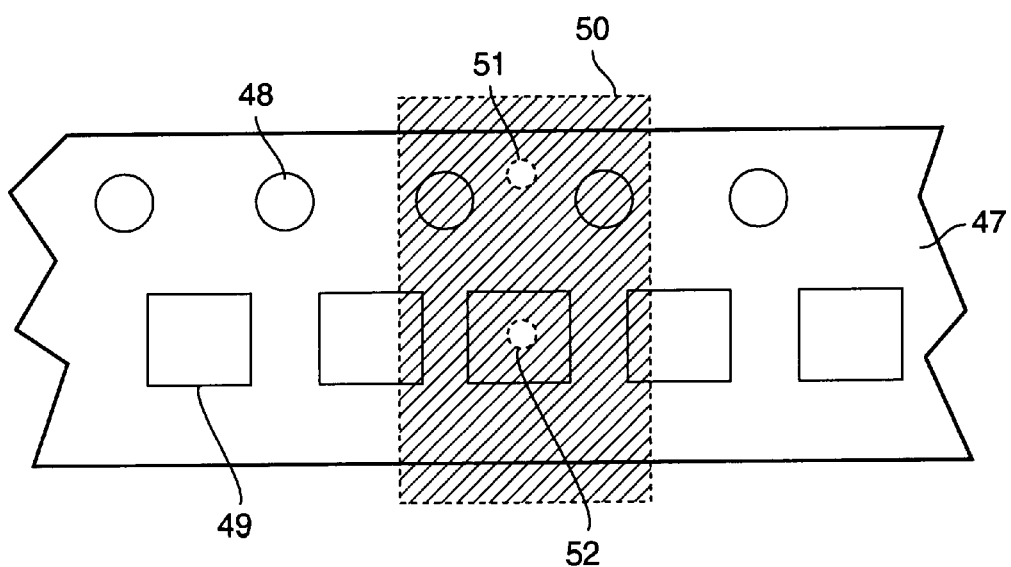
FIG. 3 depicts the geometrical arrangement of a splice sensor and an empty-pocket sensor in a combined tape sensor for a splice connection of FIG. 2.

In accordance with FIG. 3, the tape sensor 10 is preferably designed as a combined sensor. This means that with a tape 47 with perforations 48 and pockets 49, it cannot only detect the recess (36, 44 in FIG. 2), which signals the existence of a splice, but also a certain coded sequence of empty and full pockets which serve as markings to separate certain sections on a tape. Such tape sections are divided to collect together components manufactured in the same batch and which fit together very well in their component properties for placement (see, in this respect, U.S. Pat. No. 4,610,083) and to separate them from components from a different batch. In the combined tape sensor 10, in accordance with FIG. 4, a splice sensor 53 and an empty-pocket sensor 54 are positioned next to each other laterally to the tape direction. The optical separation of the beam paths of both sensors is performed in accordance with FIG. 3 by a diaphragm 50 which possesses a first diaphragm aperture 51 in the area of the perforations 48 and a second diaphragm aperture 52 in the area of the pockets 49. The first diaphragm aperture 51 is positioned in such a way that the recesses (36, 44) of a splice (35, 43) can be detected optimally through it. The second diaphragm aperture 52 is positioned in such a way that it can be optimally detected through it whether a pocket 49 is empty (i.e. light transmitting) or whether it contains a component (i.e. is not light transmitting).

Figure 4:
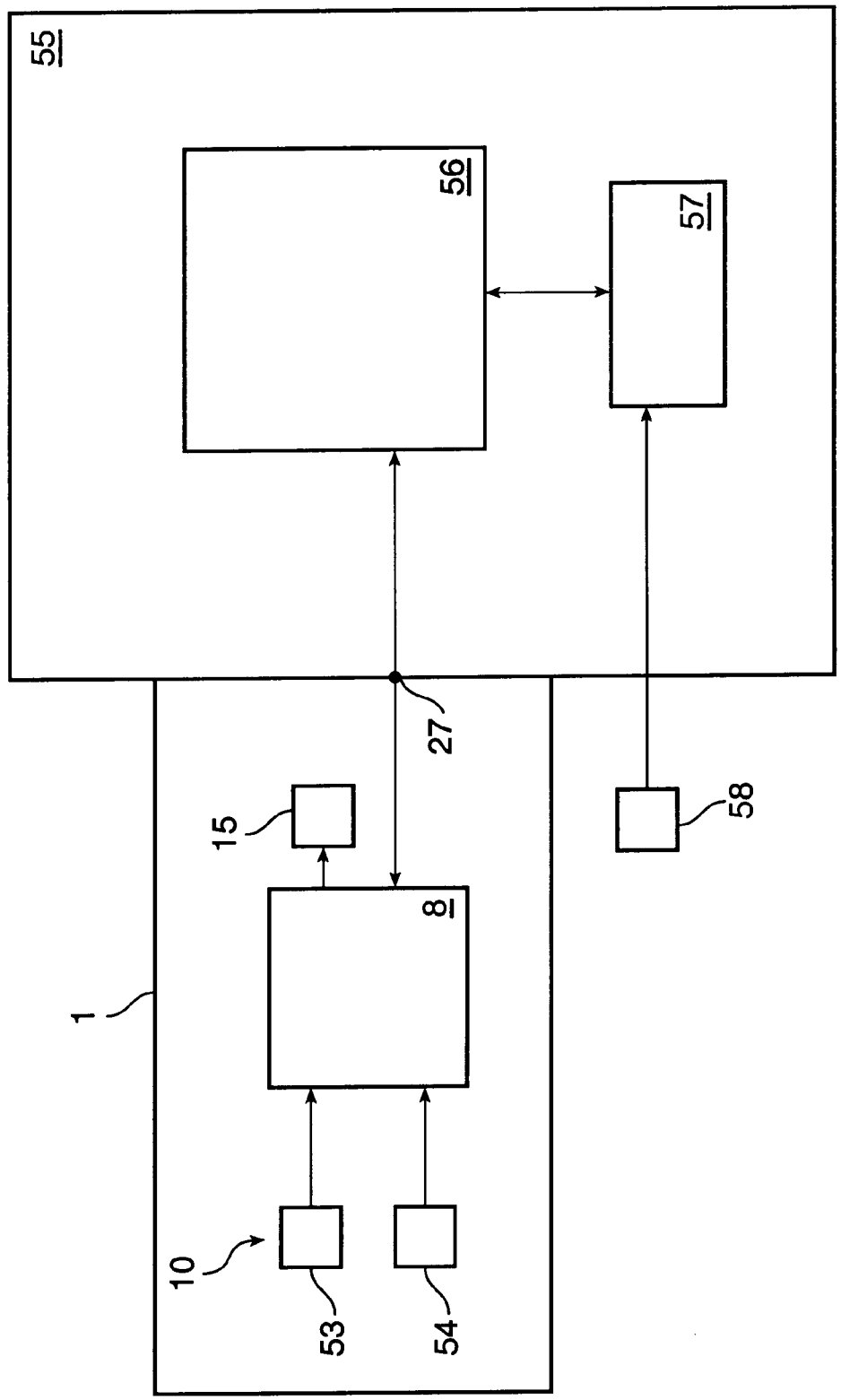
FIG. 4 depicts a block circuit diagram of the control of a feeder and placement machine in accordance with a preferred embodiment of the invention.

The interaction of the feeder 1 with the placement machine 55 with regard to the detection of a splice or of sections of a tape can be explained by means of the block circuit diagram shown in FIG. 4. The feeder 1 is inserted on the placement machine 55. In this way, via a plug contact 27 (see also FIG. 1), a connection is made for the exchange of data between the (local) control unit 8 of the feeder means 1 and the central processing unit 56 of the placement machine 55. The splice sensor 53 and the empty-pocket sensor 54 are connected to the control unit 8, however, it is also imaginable that the two sensors 53, 54 are connected directly with the central processing unit 56 via the plug contact 27. Furthermore, in the placement machine 55 a data memory 57 is allocated to the central processing unit 56 in which (either, as shown, directly or via the central processing unit 56), by means of an entry unit 58, characteristic data of a tape together with the components located on it to be processed in the feeder 1 can be entered and stored. If, for example, the characteristic data are applied to the reel in the form of a barcode strip, the entry unit can be designed as a barcode reader. But other methods with magnetic strips, a keyboard or similar are also imaginable.

If a first tape with components is just being processed in the feeder means 1, the characteristic data of the tape are filed in the central processing unit 56. The control unit 8 controls the drive motor 15 for the tape in the feeder 1 in accordance with the commands from the central processing unit 56 so that the tape is transported past the pick-up position 13 in steps and the pick-up head can pick up a component from the pocket of the tape as required at the pick-up position and take it for placement. If now the approaching end of the tape is signalled, (e.g. due to a coded empty pocket sequence detected by the empty-pocket sensor 54), a message appears on the placement machine for the operator that the tape is running out in this certain feeder. With the feeder inserted, the operator then takes the first reel with the first tape from the reel cassette 19 (FIG. 1), releases the tape end of the first tape from the first reel and splices the tape start of a second tape located on a second reel with the tape end of the first tape. Subsequently, by means of the entry unit, the characteristic data (tape length, tape width, pitch, component type, etc.) are read off the second reel and entered into the data memory 57. The second reel can then be inserted in the reel cassette of the feeder 1. This is all done without having to interrupt the ongoing placement process.

When now in the further course of the processing of the first tape, the splice with the second tape is detected by the splice sensor 53 in the tape sensor 10, the contents of the data memory 57 are read out by the central processing unit 56 and subsequently compared with the characteristic data of the first tape existing there. If the data agree in a predetermined manner, which ensures that the correct follow-up tape has been selected and spliced on, the data from the data memory 57 are released for use and the processing of the second tape begins. If a lack of agreement is found, this is signalled to the operator as a warning and the further processing of the second tape is aborted. In this way, the reloading of components can be ensured with simultaneously high operating security and without any loss in performance.

Figure 5:
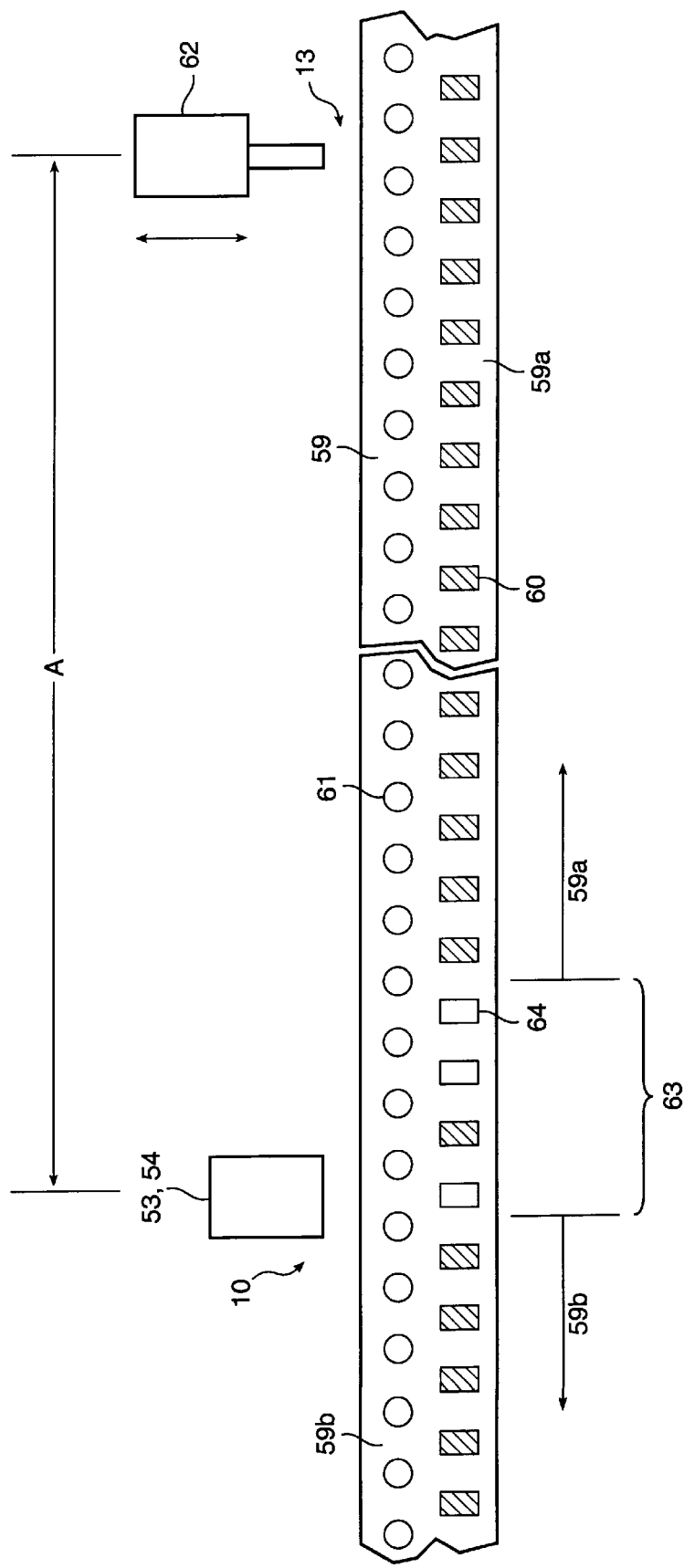
FIG. 5 depicts the allocation of tape sensor and pick-up position relative to the pitch of the tape in a presently preferred embodiment of the invention.

The use of the empty-pocket sensor 54 in the tape sensor 10 assumes that in accordance with FIG. 5, each tape 59 is divided into sequential tape sections 59a, 59b, components of the same type and from the same batch being stored in each case in each of the tape sections 59a, 59b. A marking 63 is provided in each case between subsequent tape sections 59a, 59b, which preferably comprises a coded sequence of empty pockets 64 and full pockets 60. When the tape 59 runs through the feeder 1, the markings 63 between the tape sections 59a, 59b are detected by the empty-pocket sensor 54.

When tapes divided into tape sections are used, a circuit to be mounted by a placement machine 55 is usually mounted in each case with a plurality of components from the same batch. On the detection of a tape section change (e.g. from 59a to 59b), the placement machine 55 or its central processing unit 56 now automatically checks whether there is still a sufficient number of components of one batch in the tape section just being used to mount a certain number of further circuits. If this is not the case, the placement machine 55 instructs the feeder 1 to advance immediately to the start of the new tape section. If, in contrast, this is the case, the placement machine 55 instructs the feeder means 1 to advance to the beginning of the new tape section after the mounting of the certain number of further circuits. For the case that a splice is detected at the end of the tape section currently being used, the placement machine 55 instructs the feeder 1 to advance to the beginning of the next tape.

To ensure that the advancing in steps of the tape 59 in the feeder means 1 leads safely and precisely to the new tape section or to the beginning of the spliced next tape, it is appropriate and advantageous to select the distance A between the position of the tape sensor 10 or the splice sensor 53 and the empty-pocket sensor 54 and the position of the pick-up head 62 (both are shown schematically in FIG. 5) as an integer multiple of the simple pitch (2 mm), e.g. 120 mm or 148 mm. The simple pitch here corresponds to half the distance between consecutive perforations 61. The placement machine or the feeder then knows exactly after so many steps of advancing the tape that the next tape section or the next tape is available for component pick-up.

What is claimed is:

1. A feeder comprising:
   a reel cassette for holding a first reel with a first tape having a plurality of components;
   a transport mechanism for advancing said first tape in steps for disposing said plurality of components periodically one after the other at a pickup position;
   connection means for exchanging data with a placement machine; and
   a splice sensor for detecting a splice that connects said first tape to a second tape wound on a second reel and for emitting, upon detection of said splice, a signal to said connection means, whereby said signal allows for an automatic and synchronous take over of said data of said second tape.

2. The feeder of claim 1 wherein said connection means and said splice sensor are coupled to a control unit.

3. The feeder of claim 1, further including a tape section sensor designed as an empty pocket sensor.

4. The feeder of claim 3, wherein said splice sensor and said tape section sensor are designed as optically operating light sensors.

5. The feeder of claim 3, wherein said splice sensor and said tape section sensor are combined as a tape sensor and wherein said splice sensor and tape section sensor are positioned laterally adjacent to a tape travel direction.

6. The feeder of claim 1, wherein said splice sensor is positioned at a predetermined distance from said pick-up position and wherein said predetermined distance is an integer multiple of a pitch of said tape.

7. The feeder of claim 3, wherein said splice sensor and said tape section sensor are positioned at a predetermined distance from said pick-up position and wherein said predetermined distance is an integer multiple of a pitch of said tape.

8. The feeder of claim 2 further including a tape section sensor designed as an empty pocket sensor.

9. The feeder of claim 8, wherein said splice sensor and said tape section sensor are designed as optically operating light sensors.

10. The feeder of claim 8, wherein said splice sensor and said tape section sensor are combined as a tape sensor and wherein said splice sensor and said tape section sensor are positioned laterally adjacent to a tape travel direction.

11. The feeder of claim 2, wherein said splice sensor is positioned at a predetermined distance from said pick-up position and wherein said predetermined distance is an integer multiple of a pitch of said tape.

12. The feeder of claim 8, wherein said splice sensor and said tape section sensor are positioned at a predetermined distance from said pick-up position wherein said predetermined distance is an integer multiple of a pitch of said tape.

* * * * *